United States Patent
Vergis et al.

(10) Patent No.: US 8,649,229 B2
(45) Date of Patent: Feb. 11, 2014

(54) MEMORY MODULE BUS TERMINATION VOLTAGE (VTT) REGULATION AND MANAGEMENT

(75) Inventors: George Vergis, Portland, OR (US); Kuljit S. Bains, Olympia, WA (US)

(73) Assignee: Intel Corporation, Santa Clara, CA (US)

( * ) Notice: Subject to any disclaimer, the term of this patent is extended or adjusted under 35 U.S.C. 154(b) by 154 days.

(21) Appl. No.: 13/172,795

(22) Filed: Jun. 29, 2011

(65) Prior Publication Data

US 2013/0003468 A1 Jan. 3, 2013

(51) Int. Cl.
*G11C 5/14* (2006.01)
(52) U.S. Cl.
USPC .................. 365/189.09; 365/189.08; 365/226
(58) Field of Classification Search
USPC ......... 365/189.09, 191, 200, 63, 189.05, 233, 365/205, 194, 230.03, 193, 236, 189.08, 365/222, 226; 326/30
See application file for complete search history.

(56) References Cited

U.S. PATENT DOCUMENTS

| | | | |
|---|---|---|---|
| 6,069,539 A | 5/2000 | Sanders et al. | |
| 7,342,411 B2 | 3/2008 | Vergis et al. | |
| 7,372,293 B2 | 5/2008 | Cox et al. | |
| 7,414,426 B2 | 8/2008 | Cox et al. | |
| 7,915,912 B2 * | 3/2011 | Oh et al. | 326/30 |
| 2003/0039151 A1 * | 2/2003 | Matsui | 365/195 |
| 2003/0137860 A1 * | 7/2003 | Khatri et al. | 365/63 |
| 2004/0100837 A1 * | 5/2004 | Lee | 365/200 |
| 2004/0196725 A1 | 10/2004 | Kang | |
| 2004/0232941 A1 * | 11/2004 | Schafer | 326/30 |
| 2007/0247185 A1 | 10/2007 | Oie et al. | |
| 2009/0077292 A1 * | 3/2009 | Tanaka | 710/260 |
| 2011/0246712 A1 | 10/2011 | Vergis et al. | |

FOREIGN PATENT DOCUMENTS

JP 2001351384 A 12/2001
KR 1020040095096 A 11/2004

OTHER PUBLICATIONS

International Search Report and Written Opinion mailed Dec. 6, 2012 for PCT Application No. PCT/US2012/039726, 9 pages.

* cited by examiner

*Primary Examiner* — Son Dinh
*Assistant Examiner* — Nam Nguyen
(74) *Attorney, Agent, or Firm* — Schwabe, Williamson & Wyatt, P.C.

(57) ABSTRACT

Embodiments of the present disclosure describe memory module bus termination voltage (VTT) regulation and management techniques and configurations. A method includes receiving, by a register, a signal that is driven over a bus to a memory device comprising a plurality of memory cells and setting, within the register, a termination voltage (VTT) for the bus based on the signal. Other embodiments may be described and/or claimed.

28 Claims, 4 Drawing Sheets

MEMORY MODULE BUS TERMINATION VOLTAGE (VTT) REGULATION AND MANAGEMENT

FIELD

Embodiments of the present disclosure generally relate to the field of integrated circuits, and more particularly, to techniques and configurations for memory module bus termination voltage (VTT).

BACKGROUND

Currently, a termination voltage (VTT) for a bus is generally provided by a motherboard of a host system to memory modules, such as dual in-line memory modules (DIMMs), using VTT supply pins. The VTT is generally shared on a same supply connection to all memory modules of a host system. A voltage regulator platform on the motherboard may maintain a voltage level for the shared VTT of the memory modules. Such current schemes may result in oversizing of the voltage regulator platform in order to accommodate a maximum capacity for memory modules of the host system although an actual number of memory modules for a system may be substantially less than the maximum capacity. Oversizing of the voltage regulator may increase a cost per host system. Also, in current schemes, an adjustment to the shared VTT level may equally apply to all of the memory modules. That is, the shared VTT may not be adjustable (e.g., set) on a per memory module basis. Further, the VTT of current schemes may not be gated/turned off for a particular memory module of the memory modules because the VTT is shared to all memory modules, which may result in lost power saving opportunities.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example and not by way of limitation in the figures of the accompanying drawings.

DETAILED DESCRIPTION

Embodiments of the present disclosure provide memory module bus termination voltage (VTT) regulation and management techniques and configurations. In the following detailed description, reference is made to the accompanying drawings which form a part hereof, wherein like numerals designate like parts throughout, and in which is shown by way of illustration embodiments in which the subject matter of the present disclosure may be practiced. It is to be understood that other embodiments may be utilized and structural or logical changes may be made without departing from the scope of the present disclosure. Therefore, the following detailed description is not to be taken in a limiting sense, and the scope of embodiments is defined by the appended claims and their equivalents.

Various operations are described as multiple discrete operations in turn, in a manner that is most helpful in understanding the claimed subject matter. However, the order of description should not be construed as to imply that these operations are necessarily order dependent. In particular, these operations may not be performed in the order of presentation. Operations described may be performed in a different order than the described embodiment. Various additional operations may be performed and/or described operations may be omitted in additional embodiments.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B and C).

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous. The term "coupled" may refer to a direct connection, an indirect connection, or an indirect communication.

As used herein, the term "module" may refer to, be part of, or include an Application Specific Integrated Circuit (ASIC), an electronic circuit, a processor (shared, dedicated, or group) and/or memory (shared, dedicated, or group) that execute one or more software or firmware programs, a combinational logic circuit, and/or other suitable components that provide the described functionality.

Figure 1:
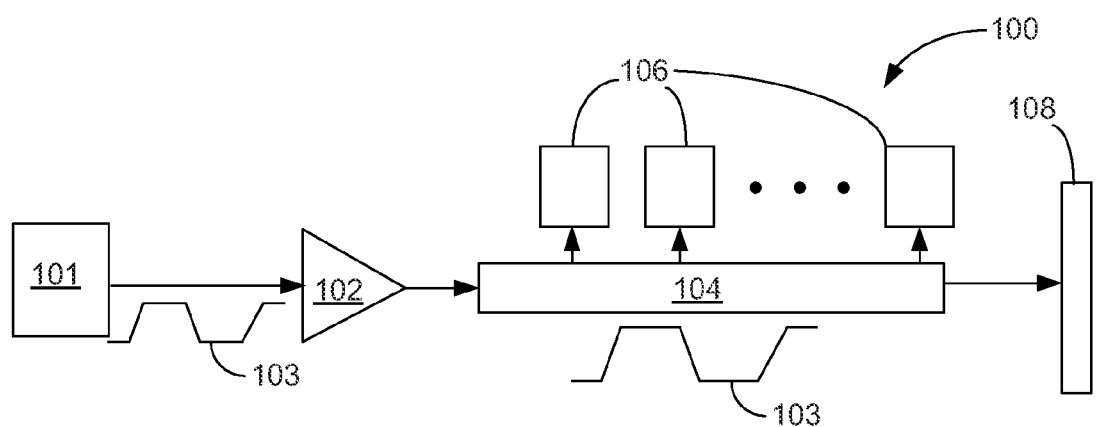
FIG. 1 schematically illustrates an example system for bus signal termination in accordance with some embodiments.

FIG. 1 schematically illustrates an example system 100 for bus signal termination in accordance with some embodiments. The system 100 includes a memory controller 101 configured to output one or more signals 103 to a register 102, which drives the one or more signals 103 over a bus 104 or transmission line to one or more memory devices 106 or other bus agents, which can be memory devices comprising a plurality of memory cells such as, for example, dynamic random access memory (DRAM) devices configured in one or more dual in-line memory modules (DIMMs). The register 102 may reside on a memory module such as a DIMM module in some embodiments.

Terminator circuitry 108 is coupled to the bus 104 to provide a termination voltage (VTT) to terminate the one or more signals 103 at the bus 104 for improved signal integrity. The terminator circuitry 108 may comprise a variety of configurations including the example configurations of circuitry 300 and circuitry 400 to generate and control the termination voltage VTT described in connection with FIGS. 3 and 4. Although the system 100 depicts the terminator circuitry 108 and the register 102 as being separate components, the terminator circuitry 108 may include components disposed within the register 102 in some embodiments.

Figure 2:
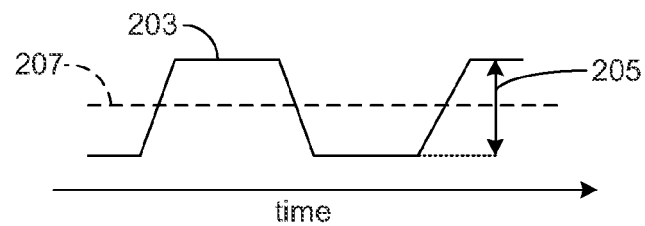
FIG. 2 schematically illustrates an example bus signal that can be used to set a termination voltage (VTT) level in accordance with some embodiments.

FIG. 2 schematically illustrates an example signal 203 that can be used to set a termination voltage (VTT) level in accordance with some embodiments. Referring to FIGS. 1 and 2, the signal 203 may be representative of a signal of the one or more signals 103 that is driven over the bus 104 by the register 102. A voltage level of the signal 203 may vary between a low state and a high state over time providing a peak-to-peak swing amplitude 205.

In some embodiments, the termination voltage VTT may be set to a mid-point level 207 of the peak-to-peak swing amplitude 205 of the signal 203. The mid-point level 207 may be calculated by dividing the peak-to-peak swing amplitude 205 by two in some embodiments. Setting the termination voltage VTT to the mid-point level 207 of the peak-to-peak swing amplitude 205 may increase noise margin symmetry for logic levels of the one or more memory devices 106, which may increase a signaling rate achievable on the bus 104.

Figure 3:
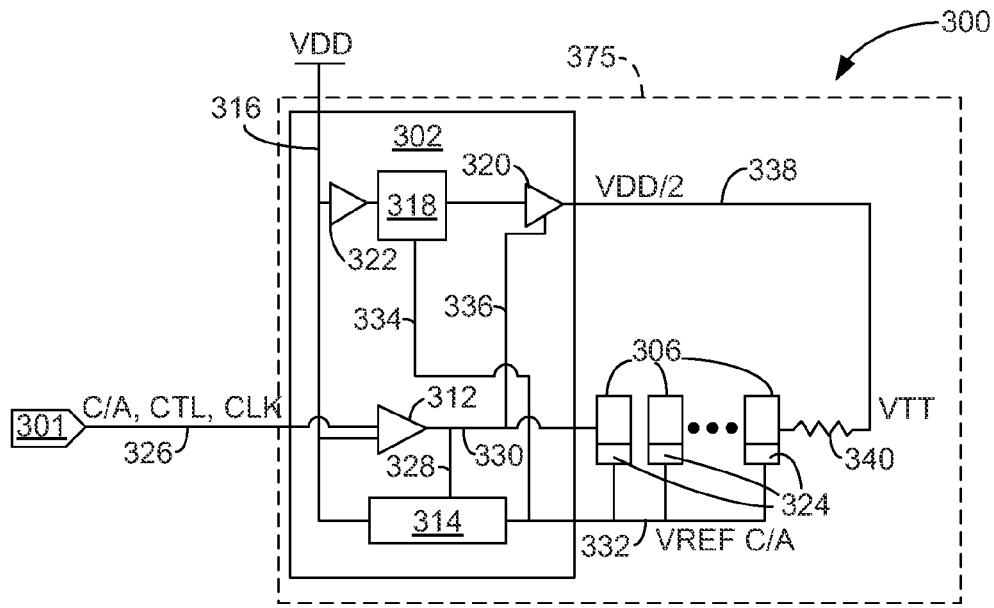
FIG. 3 schematically illustrates an example configuration of circuitry to generate and control a termination voltage (VTT) in accordance with some embodiments.

FIG. 3 schematically illustrates an example configuration of circuitry 300 to generate and control a termination voltage (VTT) in accordance with some embodiments. The circuitry 300 includes a register 302 having a driver 312 configured to receive one or more signals (e.g., the one or more signals 103 of FIG. 1) from line 326 and drive the one or more signals over line 330, which may be a bus (e.g., bus 104 of FIG. 1) or analogous transmission line, to one or more memory devices 306. In some embodiments, the one or more signals driven by the driver 312 comprise one or more of command/address (C/A), control (CTL), and/or clock (CLK) signals sent by a processor (e.g., 2020 of FIG. 6) of a host system (e.g., host system 2000) through memory controller 301 or other host system component.

Although a single line is depicted for each of line 326 and line 330, the single line may be representative of multiple lines or connections. For example, line 326 and line 330 may represent an address bus for each memory device of the one or more memory devices 306. The address bus may have multiple signal lines. In an embodiment, each of line 326 and line 330 represents an address bus having between about 30 and 36 signal lines where 22 to 26 of the signal lines are for C/A signals, 1 to 5 signal lines are for CTL signals, and 4 to 8 signal lines are for CLK signals. In an embodiment, an address bus represented by line 326 and line 330 is provided for each memory device of the one or more memory devices 306. According to various embodiments, each memory device is a DRAM unit. The circuitry 300 may include a driver 312 for each signal line of the address bus in some embodiments.

The register 302 may further include a reference voltage (VREF) control module 314 coupled to a supply voltage (VDD) line 316, as can be seen. The VREF control module 314 may be configured to generate, within the register 302, a VREF signal that is output on line 332. The VREF signal may provide a threshold value of logic high and low levels for one or more receivers 324 respectively associated with the one or more memory devices 306. According to various embodiments, the VREF signal includes a VREF C/A signal.

The VREF signal may be set at a mid-point of the peak-to-peak swing amplitude (e.g., peak-to-peak swing amplitude 205 of FIG. 2) of the one or more signals driven over line 330. Setting the VREF signal to the mid-point of the peak-to-peak swing amplitude may provide improved noise margin of the logic levels at the one or more receivers 324. The VREF control module 314 may access the one or more signals (e.g., C/A, CTL, CLK signals) driven over line 330 using line 328. The VREF signal may be trained such that the VREF signal tracks the one or more signals. For example, a training procedure may be used to margin signal swing around the VREF signal. The margining may be accomplished by the host system driving patterns that create non-ideal or worst signaling conditions on the bus (e.g., line 330). Since bus signaling margin may be impacted by factors such as cross talk and any non-ideal termination voltage, a voltage for the one or more signals on line 330 may be also set, during the margining phase, as the voltage level of the VREF signal may be used as the reference voltage for the voltage regulator 318. A worst case signaling pattern may also produce a worst termination voltage loading, which may affect the margin for one or more signals on line 330. Training of the VREF signal and establishing of the termination voltage VTT based on the one or more signals on line 330 may rectify cross-talk and/or loading issues. The VREF signal can be trained using any of a variety of well-known training algorithms used in signal transmission. In this regard, the VREF signal may be generated based on the one or more signals received by the register 302 and set to a mid-point of the peak-to-peak swing amplitude of the one or more signals.

In some embodiments, the VREF control module 314 may set the VREF signal to a level of about half of the supply voltage VDD, or VDD/2. Other modifications greater or lower than about half of the supply voltage VDD may be made to set the VREF signal in other embodiments.

The register 302 may further include a voltage regulator 318 coupled to the supply voltage line 316, as can be seen. The voltage regulator 318 may be configured to maintain a constant voltage level across varying current load for the termination voltage VTT that is output from the voltage regulator 318 on line 338. According to various embodiments, the voltage regulator 318 uses line 334 to access the VREF signal on line 332 as a reference level for setting the termination voltage VTT. That is, in some embodiments, the VREF control module 314 is configured to set a VREF signal that is used as a reference level for the voltage regulator 318 to set the termination voltage VTT.

The voltage regulator 318 may set the termination voltage VTT to the mid-point of the peak-to-peak swing amplitude of the one or more signals by referencing the VREF signal on line 332, which VREF signal may also be set to the mid-point of the peak-to-peak swing amplitude based on the one or more signals. In this regard, the voltage regulator 318 may be configured to set, within the register 302, the termination voltage VTT for the bus (e.g., line 330) based on the one or more signals. In some embodiments, the termination voltage VTT tracks the VREF signal, which tracks the one or more signals driven over line 330. Thus, the termination voltage VTT may be based on the one or more signals driven over line 330. According to various embodiments, terminator circuitry of circuitry 300 includes voltage regulator 318, line 338 and termination resistor 340 coupled to the one or more memory devices 306, as can be seen. The termination resistor 340 may comprise a resistance of about 38 ohms in some embodiments.

In some embodiments, the voltage regulator 318 and the VREF signal on line 332 can be decoupled by disabling line 334 using, e.g., a gate (not shown). A voltage level offset may be applied between the VREF signal output by the VREF control module 314 and the termination voltage VTT output by the voltage regulator 318 to provide a termination voltage VTT that tracks the VREF signal at an offset voltage level.

The voltage regulator 318 and the driver 312 may share a common supply voltage line 316, which may be a common supply voltage rail in some embodiments. Thus, any noise in the supply voltage line 316 may be equally seen by the voltage regulator 318 and the driver 312 providing a fixed noise margin. In this manner, the termination voltage VTT may track the one or more signals driven over line 330. The VREF control module 314 also shares the common supply voltage line 316, which may provide similar fixed noise margin benefits for the VREF signal output on line 332.

According to various embodiments, the circuitry 300 is provided for a single memory module 375 such as a DIMM. Other circuitry similar to circuitry 300 may be provided for each memory module (e.g., DIMM) of a host system. Such configuration of the voltage regulator 318 may deterministically provide a termination voltage VTT that can be set, for example, for an actual loading of the DIMMs in a host system as opposed to relying on a termination voltage supply that is shared to all DIMMs and set based on a maximum loading capacity of DIMMs. Further, providing the voltage regulator 318 on a register 302, which may be part of a DIMM, may allow adjustment of the termination voltage VTT on a per-DIMM basis. The termination voltage VTT may be set according to bus conditions. For example, bus conditions that may affect one or more signals that are driven over line 330 may include signal pattern, switching frequency, load driven over the bus, and driver fluctuations.

The register 302 may further include a gate 320 coupled to line 338, as can be seen. The gate 320 may be configured to gate (e.g., turn off) the termination voltage VTT to provide power savings as part of a power management scheme. The power management scheme may allow gating of the termination voltage VTT the single memory module 375 (e.g., a particular DIMM) while allowing other memory modules (e.g., DIMMs) to continue operation with separate independently generated termination voltages VTTs in some embodiments.

In some embodiments, the termination voltage VTT is gated at gate 320 based on C/A, CTL, and/or CLK signals that are driven over line 330. The C/A, CTL, and/or CLK signals may be intercepted by the gate 320 using line 336 and such signals may be used to power manage and/or gate the termination voltage VTT on line 338. Gating logic that determines when to gate the gate 320 may be based on an explicit command or an inferred command. For example, an inferred command may include an activity state or a command issued to the register 302 or to the one or more memory devices 306 using a command/control protocol. In an embodiment, a clock enable (CKE) control signal that puts the one or more memory devices 306 into power savings mode is used to trigger gating of the gate 320 to disable the termination voltage VTT on line 338. An additional gate 322 may be placed at an input of the supply voltage line 316 to the voltage regulator 318 to gate the supply voltage VDD to the voltage regulator 318 for additional power efficiency. The additional gate 322 may be gated using similar techniques as described in connection with gate 320. The gating logic and/or a power management module that controls power management actions may reside in the register 302.

Line 330 (e.g., bus) may be parked/driven to a valid logic level subsequent to gating power at gate 320 and/or gate 322. In an embodiment, line 330 is driven to a low logic level when gate 320 and/or gate 322 is enabled (e.g., power turned off).

Other power management schemes can be implemented in other embodiments. As an alternative to gating the power to the termination voltage VTT on line 338 using gate 320 and/or gate 322, power consumption can be reduced for the circuitry 300 by driving the line 330 (e.g., bus) and the termination voltage VTT on line 338 to a same valid logic level (e.g., low or high). Driving the line 330 and the termination voltage VTT on line 338 to the same logic level may be performed in response to similar conditions/triggers as described in connection with gating at gate 320. In an embodiment, the line 330 is driven to a low logic level and the termination voltage VTT is driven to ground (e.g., 0 V). The logic level for line 330 and line 338 may be set by memory controller 301 using a command/address bus (e.g., line 326) of the register 302.

Figure 4:
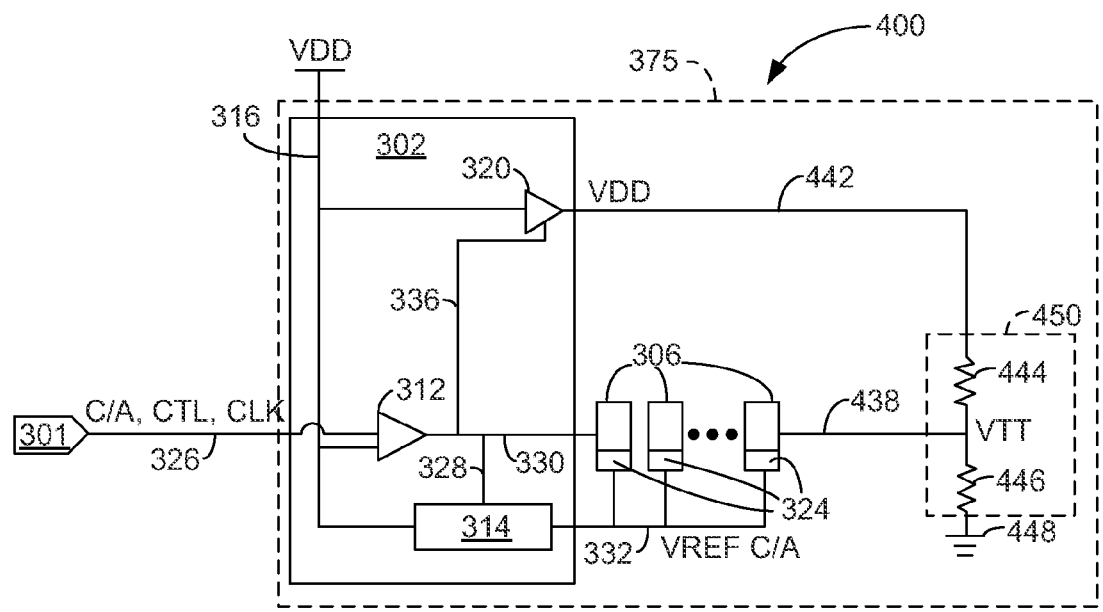
FIG. 4 schematically illustrates another example configuration of circuitry to generate and control a termination voltage (VTT) in accordance with some embodiments.

FIG. 4 schematically illustrates another example configuration of circuitry 400 to generate and control a termination voltage (VTT) in accordance with some embodiments. According to various embodiments, the circuitry 400 may include similar components as described in connection with circuitry 300. For example, the circuitry 400 includes register 302, one or more memory devices 306, memory controller 301, VREF control module 314, driver 312, supply voltage line 316, gate 320, line 326, line 328, line 330, line 332, line 336, and single memory module 375 as described in connection with circuitry 300. Components of circuitry 400 that include similar reference numerals as circuitry 300 may comport with embodiments already described in connection with circuitry 300. Circuitry 400 may comport with embodiments for power management described in connection with circuitry 300.

Circuitry 400 includes line 442, which carries the supply voltage VDD from supply voltage line 316 to a voltage divider 450, which may be external to the register 302. The voltage divider 450 includes termination resistors 444 and 446, which may be a respective pull-up and pull-down resistor. The voltage divider 450 may be coupled to ground 448. Terminator circuitry of circuitry 400 may include the voltage divider 450 and line 438 coupled to the one or more memory devices 306 to provide the termination voltage VTT from the termination resistors 444 and 446.

Each of the termination resistors 444 and 446 may have a same resistance value to set the termination voltage VTT. In some embodiments, each of the termination resistors 444 and 446 has a value of about 78 Ohms. In some embodiments, the termination voltage VTT of line 438 is at a level that is about half of the supply voltage VDD level (e.g., VDD/2). The scheme presented in circuitry 400 may reduce cost and/or power dissipation in the register 302 relative to the circuitry 300 of FIG. 3.

Any short circuit current between power and ground 448 through the voltage divider 450 can be mitigated or prevented by gating the supply voltage VDD using gate 320. The gate 320 and associated gating logic may comport with embodiments already described in connection with FIG. 3. Regulation of the termination voltage VTT may rely on regulation of the supply voltage VDD.

Figure 5:
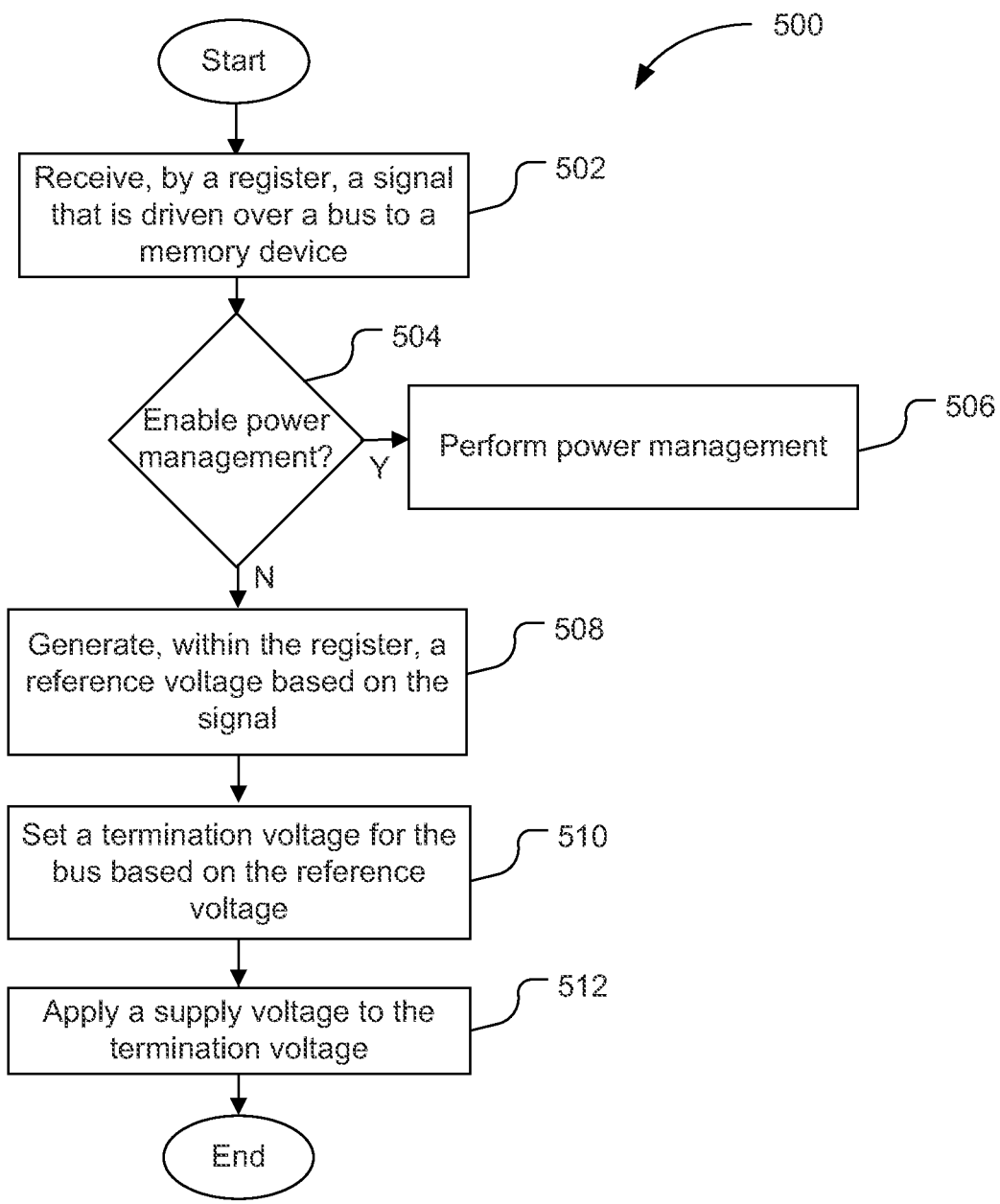
FIG. 5 is a flow diagram of a method for generating and controlling a termination voltage (VTT) in accordance with some embodiments.

FIG. 5 is a flow diagram of a method 500 for generating and controlling a termination voltage (VTT) in accordance with some embodiments. The method 500 includes receiving, by a register (e.g., register 102 of FIG. 1 or register 302 of FIGS. 3 and/or 4), a signal (e.g., signal 103 of FIG. 1 or signal received on line 326 of FIGS. 3 and/or 4) that is driven over a bus (e.g., bus 104 of FIG. 1 or line 330 of FIGS. 3 and/or 4) to a memory device (e.g., one or more memory devices 106 of FIG. 1 or one or more memory devices 306 of FIGS. 3 and/or 4), at 502. The signal may be driven over the bus using a driver (e.g., driver 312 of FIGS. 3 and/or 4).

The method 500 determines whether to enable power management at 504. A variety of conditions can be used to trigger performance of power management actions. For example, power management may be triggered/enabled based on the signal received at the register. According to various embodiments, the signal may include one of a C/A, CTL, or CLK signal that includes an explicit command or inferred command to perform power management actions. In an embodiment, a CKE control signal that is used to place the memory device in a power savings mode is intercepted (e.g., via line 336 of FIG. 3 or 4) and used to trigger power management actions.

If conditions for power management are satisfied, then the method 500 includes performing power management at 506. Power management can include the gating of power at a gate (e.g., gate 320 of FIG. 3 or 4) on a line (e.g., line 338 of FIG. 3 or line 442 of FIG. 4) that supplies voltage for the termination voltage VTT. In a case where a voltage regulator (e.g., voltage regulator 318 of FIG. 3) is implemented in the register 302, an additional gate (e.g., additional gate 322 of FIG. 3) may be provided at an input of a supply voltage line (e.g., supply voltage line 316 of FIG. 3) to the voltage regulator. The additional gate may be triggered to turn off the supply voltage line at the input to the voltage regulator using similar conditions as the gate. The bus may be parked or otherwise driven to a valid logic level (e.g., low logic level) when the gate and/or additional gate are enabled such that the supply voltage to the termination voltage VTT is turned off.

In other embodiments, when power management is triggered/enabled, the bus and the termination voltage VTT are driven to a same valid logic level. The bus and the termination voltage VTT may be at the same potential resulting in no flow of current. The levels for the bus and the termination voltage VTT can be set through an input command/address bus of the register by a memory controller (e.g., memory controller 101 of FIG. 1).

If power management is not enabled at 504, then the method 500 further includes generating, within the register, a reference voltage (e.g., VREF C/A on line 332 of FIG. 3 or 4) based on the signal at 508. The reference voltage may be trained to establish a mid-point level (e.g., mid-point level 207 of FIG. 2) of a peak-to-peak swing amplitude (e.g., peak-to-peak swing amplitude 205 of FIG. 2) of the signal.

In some embodiments, the method 500 further includes setting a termination voltage VTT for the bus based on the reference voltage at 510. For example, a voltage regulator may use the reference voltage (e.g., via line 334 of FIG. 3) as a reference level to set the termination voltage VTT. In these embodiments, the termination voltage VTT may be set based on the reference voltage, which is based on the signal. In this regard, the termination voltage VTT may be set based on the signal.

Method 500 further includes applying a supply voltage to the termination voltage at 512. The termination voltage VTT may be output ready such that when the supply voltage VDD is applied, the termination voltage results. For example, in circuitry 300 of FIG. 3, the supply voltage VDD may be applied on supply voltage line 316, which results in the termination voltage VTT on line 338. In circuitry 400 of FIG. 4, the supply voltage may be applied on supply voltage line 316 resulting in the termination voltage VTT on line 438.

Techniques and configurations described herein may allow termination voltage VTT generation and control to be part of a bus/memory module such as a DIMM. Cost associated with the voltage regulator may be proportional to a number of DIMMs of a host system. Further, the termination voltage VTT may be turned off on an individual DIMM basis.

Figure 6:
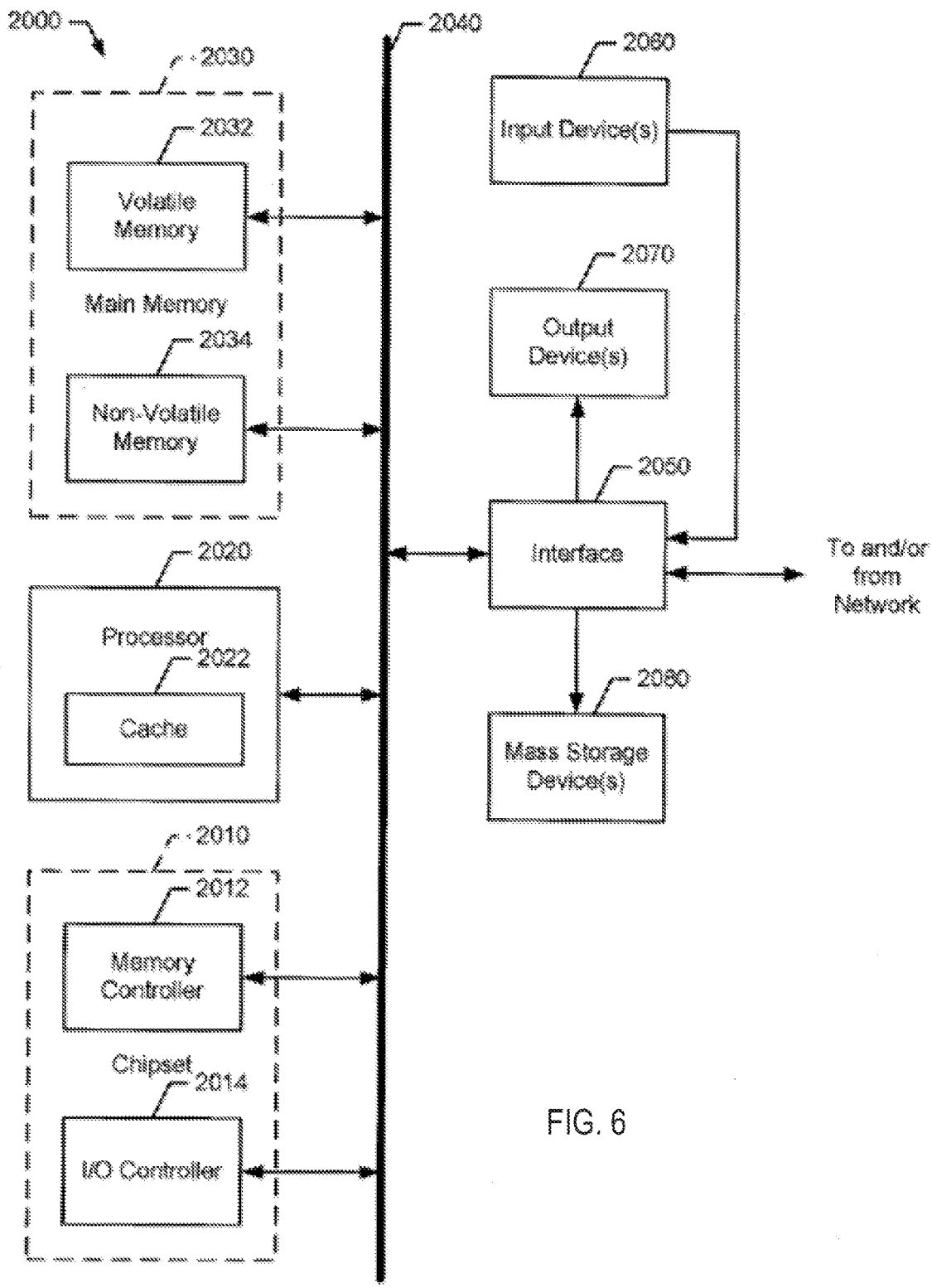
FIG. 6 schematically illustrates an example host system that may be used to practice various embodiments described herein.

FIG. 6 schematically illustrates an example host system 2000 that may be used to practice various embodiments described herein. The host system 2000 may be a desktop computer, a laptop computer, a handheld computer, a tablet computer, a PDA, a server, an Internet appliance, a mobile handset and/or any other type of computing device.

The host system 2000 includes a chipset 2010, which includes a memory controller 2012 and an input/output (I/O) controller 2014. The chipset 2010 may provide memory and I/O management functions as well as a plurality of general purpose and/or special purpose registers, timers, etc. that are accessible or used by a processor 2020. The processor 2020 may include a cache 2022, which may be implemented using a first-level unified cache (L1), a second-level unified cache (L2), a third-level unified cache (L3), and/or any other suitable structures to store data.

The memory controller 2012 may perform functions that enable the processor 2020 to access and communicate with a main memory 2030 including a volatile memory 2032 and a non-volatile memory 2034 via a bus 2040. While FIG. 6 shows a bus 2040 to communicatively couple various components to one another, other embodiments may include additional/alternative interfaces. In some embodiments, memory controller 2012 may comport with embodiments described in connection with memory controller 101 of FIG. 1, bus 2040 may comport with embodiments described in connection with bus 104 of FIG. 1, and main memory 2030 may comport with embodiments described in connection with one or more memory devices 106.

The volatile memory 2032 may be implemented by synchronous dynamic random access memory (SDRAM), dynamic random access memory (DRAM), RAMBUS dynamic random access memory (RDRAM), and/or any other type of random access memory device. The non-volatile memory 2034 may be implemented using flash memory, read only memory (ROM), electrically erasable programmable read only memory (EEPROM), and/or any other desired type of memory device.

An article of manufacture is disclosed herein. The article of manufacture may include a computer-readable medium having instructions stored thereon, which if executed, result in the actions described herein. The computer-readable medium may include, for example, components of main memory 2030 and/or the mass storage device(s) 2080 or any other suitable storage medium.

The host system 2000 may also include an interface circuit 2050 that is coupled to the bus 2040. The interface circuit 2050 may be implemented using any type of interface standard such as an Ethernet interface, a universal serial bus (USB), a third generation input/output interface (3GIO) interface, and/or any other suitable type of interface.

One or more input devices 2060 may be connected to the interface circuit 2050. The input device(s) 2060 permit an individual to enter data and commands into the processor 2020. For example, the input device(s) 2060 may be implemented by a keyboard, a mouse, a touch-sensitive display, a track pad, a track ball, an isopoint, and/or a voice recognition system.

One or more output devices 2070 may also be connected to the interface circuit 2050. For example, the output device(s) 2070 may be implemented by display devices (e.g., a light emitting display (LED), a liquid crystal display (LCD), a cathode ray tube (CRT) display, a printer and/or speakers). The interface circuit 2050 may include, among other things, a graphics driver card.

The host system 2000 may also include one or more mass storage devices 2080 to store software and data. Examples of such mass storage device(s) 2080 include floppy disks and drives, hard disk drives, compact disks and drives, and digital versatile disks (DVD) and drives.

The interface circuit 2050 may also include a communication device such as a modem or a network interface card to facilitate exchange of data with external computers via a network. The communication link between the host system 2000 and the network may be any type of network connection such as an Ethernet connection, a digital subscriber line (DSL), a telephone line, a cellular telephone system, a coaxial cable, etc.

In some embodiments, the interface circuit 2050 may include a wireless network interface controller having one or more antennae (not shown in the figure) to establish and maintain a wireless communication link with one or more components of a wireless network. The system host system 2000 may wirelessly communicate with the one or more components of the wireless network in accordance with any of one or more wireless network standards and/or protocols.

In some embodiments, the host system 2000 may be coupled to an antenna structure (not shown in the figure) to provide access to other devices of a network. In some embodiments, the antenna structure may include one or more directional antennas, which radiate or receive primarily in one direction (e.g., for 120 degrees), cooperatively coupled to one another to provide substantially omnidirectional coverage; or one or more omnidirectional antennas, which radiate or receive equally well in all directions.

Access to the input device(s) 2060, the output device(s) 2070, the mass storage device(s) 2080 and/or the network may be controlled by the I/O controller 2014. In particular, the I/O controller 2014 may perform functions that enable the processor 2020 to communicate with the input device(s) 2060, the output device(s) 2070, the mass storage device(s) 2080 and/or the network via the bus 2040 and the interface circuit 2050.

While the components shown in FIG. 6 are depicted as separate blocks within the host system 2000, the functions performed by some of these blocks may be integrated within a single semiconductor circuit or may be implemented using two or more separate integrated circuits. For example, although the memory controller 2012 and the I/O controller 2014 are depicted as separate blocks within the chipset 2010, the memory controller 2012 and the I/O controller 2014 may be integrated within a single semiconductor circuit.

Although certain embodiments have been illustrated and described herein for purposes of description, a wide variety of alternate and/or equivalent embodiments or implementations calculated to achieve the same purposes may be substituted for the embodiments shown and described without departing from the scope of the present disclosure. This application is intended to cover any adaptations or variations of the embodiments discussed herein. Therefore, it is manifestly intended that embodiments described herein be limited only by the claims and the equivalents thereof.

What is claimed is:

1. A method comprising:
    receiving, by a register, a signal that is driven over a bus to a memory device comprising a plurality of memory cells;
    generating a reference voltage within the register based on the signal, wherein the reference voltage is to provide a threshold value of logic high and low levels for evaluation of the signal by a receiver of the memory device;
    setting, within the register, a termination voltage (VTT) for the bus based on the signal;
    gating the termination voltage, during a power saving mode of the memory device, based on the signal;
    setting the bus to a logic level during the power saving mode; and
    setting the termination voltage to the same logic level as the bus during the power saving mode to save power.

2. The method of claim 1, wherein setting the termination voltage for the bus based on the signal comprises:
setting the termination voltage of the bus based on the reference voltage.

3. The method of claim 2, wherein:
a voltage regulator within the register outputs the termination voltage.

4. The method of claim 3, wherein:
a driver within the register drives the signal over the bus;
the driver and the voltage regulator share a common supply voltage to the register; and
the termination voltage tracks the signal.

5. The method of claim 4, further comprising:
gating an input of the common supply voltage to the voltage regulator.

6. The method of claim 2, wherein the termination voltage and the reference voltage are each set at a mid-point of a peak-to-peak swing level of the signal.

7. The method of claim 1, wherein the signal comprises at least one of a command/address (C/A) signal, a control (CTL) signal, and a clock (CLK) signal.

8. The method of claim 1, wherein the termination voltage is gated based on a clock enable (CKE) control signal that is used to place the memory device in the power saving mode.

9. The method of claim 1, further comprising:
parking the bus to a low logic level when the termination voltage is gated.

10. An apparatus comprising:
    a register configured to a receive a signal that is driven over a bus to a memory device comprising a plurality of memory cells, wherein the signal is to be evaluated by a receiver of the memory device;
    terminator circuitry configured to generate, within the register, a termination voltage for the bus based on the signal;
    a gate coupled to an output of the voltage regulator, wherein the gate is configured to gate the termination voltage based on the signal; and
    a memory controller coupled to the register, the memory controller configured to set the bus and the termination voltage to a same logic level, to save power, when the termination voltage is gated.

11. The apparatus of claim 10, further comprising:
a reference voltage (VREF) control module within the register, wherein the VREF control module is configured to generate a reference voltage based on the signal and the reference voltage provides a threshold value of logic high and low levels for evaluation of the signal by the receiver of the memory device.

12. The apparatus of claim 11, wherein the terminator circuitry is configured to set the termination voltage of the bus based on the reference voltage.

13. The apparatus of claim 12, wherein the terminator circuitry comprises a voltage regulator within the register, the voltage regulator being configured to set the termination voltage based on the reference voltage and output the termination voltage.

14. The apparatus of claim 13, further comprising:
a supply voltage rail, wherein the voltage regulator and the VREF control module are each coupled to the supply voltage rail.

15. The apparatus of claim 14, further comprising:
a driver within the register, wherein the driver is (i) configured to drive the signal over the bus and (ii) coupled to the supply voltage rail such that the termination voltage tracks the signal.

16. The apparatus of claim 13, wherein:
the VREF control module is configured to output the reference voltage at a mid-point of a peak-to-peak swing level of the signal; and
the voltage regulator is configured to output the termination voltage at the mid-point of the peak-to-peak swing level of the signal.

17. The apparatus of claim 13, wherein the signal comprises at least one of a command/address (C/A) signal, a control (CTL) signal, and a clock (CLK) signal.

18. The apparatus of claim 17 wherein:
the signal comprises a clock enable (CKE) signal that is used to place the memory device in a power savings mode.

19. The apparatus of claim 10, wherein the same logic level is a low logic level.

20. The apparatus of claim 10, wherein the gate is a first gate, the apparatus further comprising:
a second gate coupled to an input of the supply voltage to the voltage regulator, the second gate to gate the supply voltage to the voltage regulator.

21. The apparatus of claim 11, wherein a value of the termination voltage is different from a value of the reference voltage by a pre-defined offset voltage.

22. A system comprising:
a memory controller configured to output a signal;
a register of a memory module configured to receive the signal, the register comprising:
a supply voltage rail,
a driver coupled to the supply voltage rail, the driver to drive the signal over a bus to a memory device of the memory module, the memory device comprising a plurality of memory cells, and
a reference voltage (VREF) control module coupled to the supply voltage rail, the VREF control module to output a reference voltage that provides a threshold value of logic high and low levels for evaluation of the signal by a receiver of the memory device; and
terminator circuitry coupled to the supply voltage rail, the terminator circuitry to generate a termination voltage for the bus;
wherein the memory controller is configured to set the bus and the termination voltage to a same logic level during a power saving mode.

23. The system of claim 22, wherein the VREF control module is configured to generate the reference voltage based on the signal.

24. The system of claim 23, wherein the terminator circuitry is configured to generate the termination voltage of the bus based on the reference voltage.

25. The system of claim 24, wherein the terminator circuitry comprises:
a voltage regulator within the register, the voltage regulator being configured to output the termination voltage; and
a termination resistor coupled to the voltage regulator and the memory device.

26. The system of claim 24, further comprising:
a gate coupled to an output of the voltage regulator, wherein the gate is configured to gate the termination voltage based on the signal, the signal comprising at least one of a command/address (C/A) signal, a control (CTL) signal, and a clock (CLK) signal.

27. The system of claim 22, wherein:
the terminator circuitry comprises a voltage divider coupled to the memory device, the voltage divider comprising a pull-up resistor and a pull-down resistor that are external to the register.

28. The system of claim 22, further comprising:
the memory device, wherein the memory device comprises a dynamic random access memory (DRAM) device, wherein the memory module comprises a dual in-line memory module (DIMM), and wherein the register is part of the DIMM.

* * * * *